(12) United States Patent
Abramov

(10) Patent No.: US 11,855,479 B2
(45) Date of Patent: Dec. 26, 2023

(54) DUAL BATTERY SYSTEM

(71) Applicant: REDARC TECHNOLOGIES PTY LTD, Morphett Vale (AU)

(72) Inventor: Igor Abramov, Woodcroft (AU)

(73) Assignee: Redarc Technologies Pty Ltd.

( * ) Notice: Subject to any disclaimer, the term of this patent is extended or adjusted under 35 U.S.C. 154(b) by 301 days.

(21) Appl. No.: 17/427,968

(22) PCT Filed: Feb. 3, 2020

(86) PCT No.: PCT/AU2020/050071
§ 371 (c)(1),
(2) Date: Aug. 3, 2021

(87) PCT Pub. No.: WO2020/160597
PCT Pub. Date: Aug. 13, 2020

(65) Prior Publication Data
US 2022/0029448 A1    Jan. 27, 2022

(30) Foreign Application Priority Data

Feb. 5, 2019    (AU) ................................ 2019900341

(51) Int. Cl.
*H02J 7/14*    (2006.01)
*H02J 7/00*    (2006.01)
(Continued)

(52) U.S. Cl.
CPC .............. *H02J 7/1423* (2013.01); *B60L 50/64* (2019.02); *B60L 53/00* (2019.02); *B60L 58/12* (2019.02);
(Continued)

(58) Field of Classification Search
CPC .... H02J 7/1423; H02J 7/0048; H02J 7/00712; H02J 7/0063; H02J 7/14; H02J 7/00;
(Continued)

(56) References Cited

U.S. PATENT DOCUMENTS 6,229,279 B1    5/2001    Dierker
2003/0210014 A1    11/2003    Jabaji et al.
(Continued)

FOREIGN PATENT DOCUMENTS

JP              5762092      8/2015
WO    WO 2012/104264 A2    8/2012
WO    WO 2014/025069 A1    2/2014

OTHER PUBLICATIONS

International Search Report for PCT/AU2020/050071 dated Apr. 9, 20200, 4 pages.
(Continued)

*Primary Examiner* — Robert L Deberadinis
(74) *Attorney, Agent, or Firm* — Fish & Richardson P.C.

(57) ABSTRACT

A dual battery system, including: a primary battery which drives a starter motor; an auxiliary battery which drives one or more auxiliary loads; an alternator which supplies current to recharge the primary battery; and a power supply circuit which supplies current from the alternator to recharge the auxiliary battery when a surplus condition is detected, the surplus condition indicating that the alternator is generating more electrical power than is required for recharging the primary battery, wherein the power supply circuit ceases to supply current to recharge the auxiliary battery when absence of the surplus condition is detected so that the primary and auxiliary batteries become electrically isolated, thereby ensuring that recharging of the auxiliary battery does not have an adverse effect on the level of charge of the primary battery.

11 Claims, 2 Drawing Sheets

(51) Int. Cl.
*H01M 10/42* (2006.01)
*H01M 10/44* (2006.01)
*H01M 10/48* (2006.01)
*B60L 53/00* (2019.01)
*B60L 50/64* (2019.01)
*B60L 58/12* (2019.01)
*B60R 16/033* (2006.01)

(52) U.S. Cl.
CPC ....... *B60R 16/033* (2013.01); *H01M 10/4207* (2013.01); *H01M 10/4257* (2013.01); *H01M 10/441* (2013.01); *H01M 10/482* (2013.01); *H02J 7/0048* (2020.01); *H02J 7/0063* (2013.01); *H02J 7/00712* (2020.01); *H01M 2010/4271* (2013.01); *H01M 2220/20* (2013.01)

(58) Field of Classification Search
CPC .......... B60L 50/64; B60L 58/12; B60R 58/12; B60R 16/033; H01M 10/4207; H01M 10/441; H01M 10/482; H01M 2010/4271; H01M 2220/20
See application file for complete search history.

(56) References Cited

U.S. PATENT DOCUMENTS

| | | |
|---|---|---|
| 2005/0287880 A1 | 12/2005 | Okuyama |
| 2006/0058897 A1 | 3/2006 | Senda et al. |
| 2018/0233943 A1 | 8/2018 | Koizumi |
| 2018/0272968 A1 | 9/2018 | Yasunori |

OTHER PUBLICATIONS

Hoque, M. M et al. "Battery charge equalization controller in electric vehicle applications: A review", Renewable and Sustainable Energy Reviews 75(2017): 1363-1385, Mar. 2017, DOT: 10.1016/j.rser.2016.11.126 <URL: https://www.researchgate.net/publication/311552963_Battery_charge_equalization_cont roller_in_electric_ vehicle_ applications_A_review> whole document.

Extended European Search Report in European Appln No. 20751864.8, dated Nov. 3, 2022, 9 pages.

DUAL BATTERY SYSTEM

CROSS-REFERENCE TO RELATED APPLICATIONS

This application is a National Stage Application under 35 U.S.C. § 371 and claims the benefit of International Application No. PCT/AU2020/050071, filed Feb. 3, 2020, which is the country equivalent to Australia Application No. 2019900341, filed on Feb. 5, 2019. The disclosure of each of the foregoing applications is incorporated herein by reference in their entirety for all purposes.

FIELD OF THE INVENTION

This invention relates to a dual battery system and a method of controlling a dual battery system. It relates particularly but not exclusively to a dual battery system for a vehicle where an auxiliary battery for auxiliary loads can be charged with no adverse effects on a primary battery for a starter motor.

BACKGROUND TO THE INVENTION

A dual battery system is one example of a way of providing for the electrical needs of a vehicle which has a number of electrical accessories or auxiliary loads. The batteries can be connected together, so that together they supply all of the electrical needs of the vehicle. They can also be electrically separated, so that one battery supplies some of the electrical needs of the vehicle while the other battery supplies the rest, or there can be some sort of switching arrangement which allows prioritisation of one of the batteries over the other. The importance of the limiting of amount energy being sourced from starter battery is more apparent now in the time of wider use of smart alternator, start-stop and other car electrical generation limiting technologies.

A specific example of a dual battery system includes a starter battery and auxiliary battery is exemplified by U.S. Pat. No. 6,229,279. The system described in that patent includes a power switch arranged between the starter battery and the vehicle auxiliary electrical system battery. The starter or primary battery carries the primary load, which is understood to be the loads essential for starting (starting motor) and safe driving capability, and the auxiliary or secondary battery carries a secondary load which includes vehicle accessories and comfort components.

In the system of U.S. Pat. No. 6,229,279, the starter battery and auxiliary battery can be connected together in parallel during operation of the starter. This may be of some assistance if the starter battery has lost some of its charge, but ideally the starter battery should always be charged sufficiently to be able to operate the starter on its own. However, if the level of charge in the auxiliary battery is lower than that in the starter battery, the starter battery will face an additional load if the two batteries are connected during operation of the starter.

U.S. Pat. No. 6,229,279 proposes some circuit arrangements to ensure appropriate switching between the starter and auxiliary batteries, but the methods of charging the auxiliary battery in such systems are disadvantageous because of the difficulty of making correct decisions as to the times at which switches needs to be closed or opened. The penalty for the wrong decision is the discharge of the starter battery, leading to an inability to start the vehicle's engine.

SUMMARY OF THE INVENTION

According to one aspect of the present invention, there is provided a dual battery system, including:

a primary battery which drives a starter motor;

an auxiliary battery which drives one or more auxiliary loads;

an alternator which supplies current to recharge the primary battery; and a power supply circuit which supplies current from the alternator to recharge the auxiliary battery when a surplus condition is detected, the surplus condition indicating that the alternator is generating more electrical power than is required for recharging the primary battery, wherein the power supply circuit ceases to supply current to recharge the auxiliary battery when absence of the surplus condition is detected so that the primary and auxiliary batteries become electrically isolated, thereby ensuring that recharging of the auxiliary battery does not have an adverse effect on the level of charge of the primary battery.

According to another aspect of the present invention, there is provided a method of controlling a dual battery system, the method including:

driving a starter motor using a primary battery;

driving one or more auxiliary loads using an auxiliary battery;

supplying current to recharge the primary battery using an alternator;

detecting a surplus condition indicating that the alternator is generating more electrical power than is required for recharging the primary battery;

a power supply circuit supplying current from the alternator to recharge the auxiliary battery when the surplus condition is detected;

detecting absence of the surplus condition indicating that the alternator is no longer generating more electrical power than is required for recharging the primary battery; and the power supply circuit ceasing to supply current to recharge the auxiliary battery when absence of the surplus condition is detected and electrically isolating the primary and auxiliary batteries, thereby ensuring that recharging of the auxiliary battery does not have an adverse effect on the level of charge of the primary battery.

The surplus condition may be determined to exist when voltage measured across the primary battery exceeds a predetermined threshold level. If the primary battery is a lead flooded battery, a suitable threshold level is typically in the range of 11.8 to 14.0 volts. The voltage threshold level may be adjustable within that range too, rather than fixed.

Alternatively, the surplus condition may be determined to exist when a state of charge measurement of the primary battery indicates that the primary battery has a state of charge exceeding a threshold level which for example is close to 100%.

Thus, embodiments of the dual battery system provide a method of detecting the level of surplus energy available from the alternator by measuring the voltage level on the primary battery, measuring primary battery current, and/or measuring state of charge of the primary battery. Further, the primary battery state of charge may be determined using measurements of both primary battery voltage and primary battery current.

Embodiments of the dual-battery system therefore provide the primary battery obvious priority in charging over the auxiliary battery. That is, components of the dual battery system are connected in such way that the power supply circuit converts power from the primary battery to power with voltage sufficient to charge the auxiliary battery only at a time when there is surplus energy delivered from the alternator.

In preferred arrangements, the power supply circuit is further able to convert any level of input voltage from the primary battery to the required charging voltage of the auxiliary battery. The power supply circuit here has the ability to convert any level of input voltage to charging voltage of the auxiliary battery regardless of the designated voltage level of the primary battery. When the power supply circuit is not in use, it completely isolates input from output.

It is preferred that the power supply circuit operates without delay to supply or cease supply of current to the auxiliary battery as soon as the surplus condition or absence of the surplus condition is detected. That is the decision of the power supply circuit to draw current is made dynamically, as soon as the surplus condition or absence of the surplus condition is detected, without delay.

The amount of current supplied by the power supply circuit to the auxiliary battery when the surplus condition is detected may be a fixed amount. For example, the fixed amount is the maximum current available. Alternatively, the amount of current supplied by the power supply circuit to the auxiliary battery when the surplus condition is detected is proportional to the amount of current by which the voltage measured across the primary battery exceeds the threshold level.

The invention will now be described in greater detail by reference to an example embodiment. It is to be understood that the particularity of the example embodiment does not supersede the generality of the foregoing description of the invention.

DETAILED DESCRIPTION OF A PREFERRED EMBODIMENT

Figure 1:
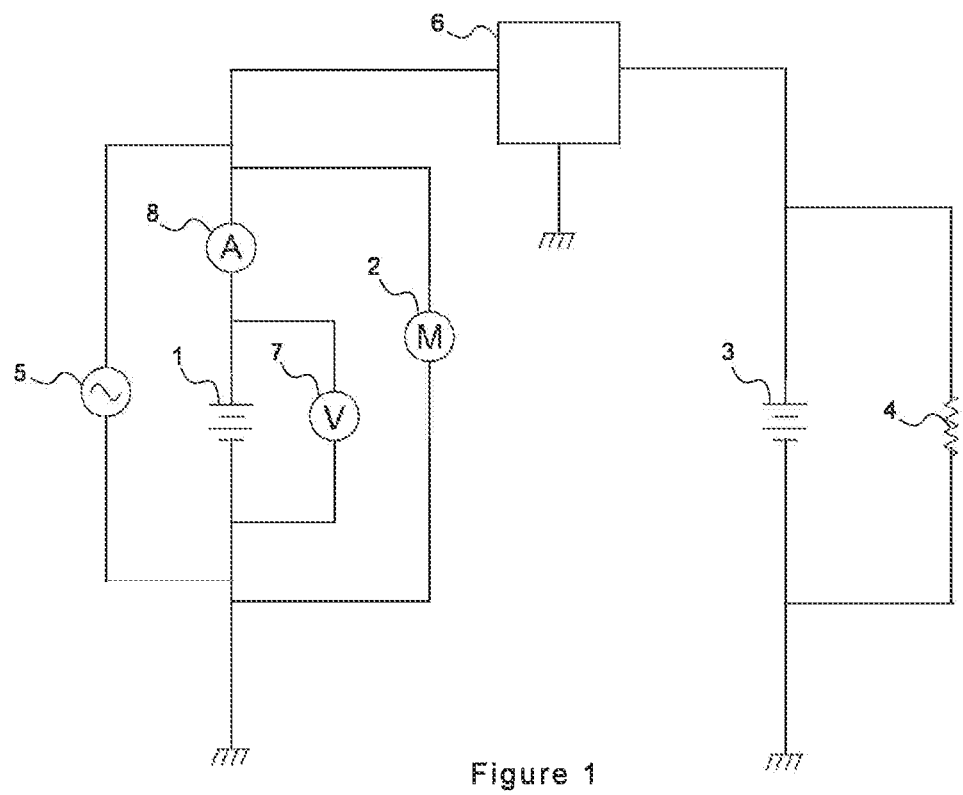
FIG. 1 shows a dual-battery system according to an embodiment of the present invention.

Referring firstly to FIG. 1 and the embodiment of the invention illustrated therein, the dual battery system for a vehicle includes a primary battery 1 which drives a starter motor 2. The system also includes an auxiliary battery 3 which drives an auxiliary load 4, which may include numerous different types of electrical equipment which typically constitute accessories to the vehicle.

The dual battery system also includes an alternator 5 which supplies current to recharge primary battery 1, and a power supply circuit 6 which supplies current from alternator 5 to recharge auxiliary battery 3 when a surplus condition is detected, indicating that alternator 5 is generating more electrical power than is required for recharging primary battery 1.

Power supply circuit 6 also immediately ceases the supply of current to recharge auxiliary battery 3 when the absence of the surplus condition is detected so that the primary battery 1 and auxiliary battery 3 become electrically isolated from each other, thereby ensuring that the recharging of auxiliary battery 3 does not have an adverse effect on the level of charge of primary battery 1.

The surplus condition may be determined to exist when voltage measured across primary battery 1 exceeds a predetermined threshold level. The threshold voltage level will typically be in the range 11.8V to 14.0V and, for the lead flooded type of battery most commonly available at present in the automotive market, a battery voltage level of between 12.7V and 13.2V indicates that the battery is almost completely charged. Thus, for the purposes of the following description, it will be assumed that the surplus condition threshold level is 12.7 volts. For other types of batteries, the threshold level will be a different amount, but it will be appreciated that a suitable threshold level is already known or can be determined for most types of batteries.

The dual battery system illustrated in FIG. 1 further includes a voltage gauge 7, which monitors the voltage across primary battery 1. As soon as the voltage exceeds the surplus condition threshold (in this example illustrated as 12.7V), power supply circuit 6 operates to supply current to recharge auxiliary battery 3. Voltage gauge 7 continues to monitor the voltage across primary battery 1, and as soon as that voltage drops below the threshold level, power supply circuit 6 operates to isolate the primary battery and alternator circuitry from auxiliary battery 3, so that priority is always given to keeping primary battery 1 in a near-fully-charged state.

Figure 4:
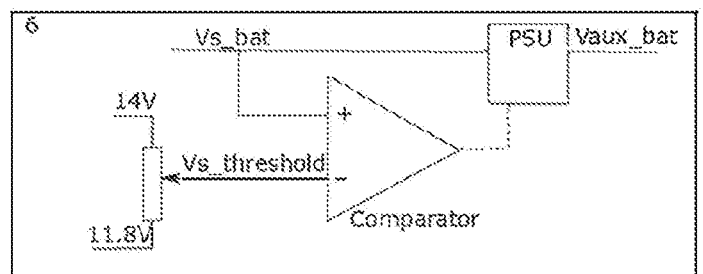
FIG. 4 is an illustrative embodiment of a power supply circuit suitable for use in the system of FIG. 1.

As an alternative to determining the surplus condition when the voltage level measured across primary battery 1 exceeds a fixed threshold voltage, the threshold voltage level can be adjustable. FIG. 4 shows one possible arrangement for power supply circuit 6, in which threshold voltage "$V_{s\_threshold}$" is adjustable to any level between 11.8V and 14.0V. The actual current voltage "$V_{s\_bat}$" of primary battery 1 is compared with $V_{s\_threshold}$ in a Comparator, and the output enables or disables power switch unit PSU, which in turn supplies power to auxiliary battery 3 if $V_{s\_bat}$ exceeds $V_{s\_threshold}$, or prevents the supply of power to auxiliary battery 3 if $V_{s\_bat}$ does not exceed $V_{s\_threshold}$.

Figure 5:
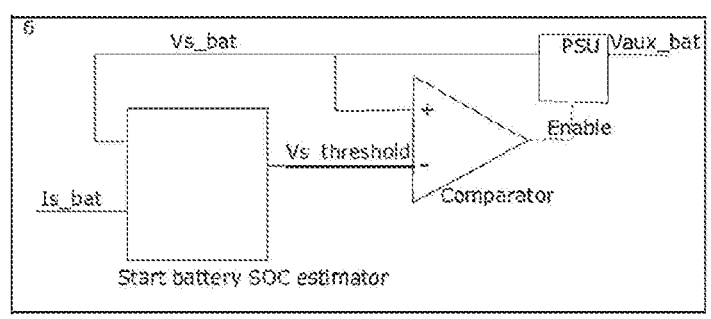
FIG. 5 is an illustrative embodiment of an alternative power supply circuit suitable for use in the system of FIG. 1.

A further alternative power supply circuit 6 is illustrated in FIG. 5. In this arrangement, the surplus condition is determined to exist when a state of charge measurement of the primary battery indicates that the primary battery has a state of charge exceeding a threshold level which is close to 100%. For example, power supply circuit 6 can be set to supply current to recharge auxiliary battery 3 as soon as the state of charge for the primary battery is measured as exceeding 95%, and power supply circuit 6 can be set to isolate the primary battery and alternator circuitry from auxiliary battery 3 as soon as the state of charge for the primary battery is measured as falling below 95%.

The dual battery system of FIG. 1 includes a current gauge 8 which measures the current flowing through primary battery 1. The detected current, shown as "$I_{s\_bat}$" in FIG. 5, and the primary battery voltage "$V_{s\_bat}$" are inputs to a "Start battery State of Charge estimator". The precise manner of estimation of state of charge is not a part of the present invention. The output of the State of Charge estimator is then used to provide an input to power switch unit PSU which in turn supplies power to auxiliary battery 3 if the state of charge exceeds an appropriate threshold, or prevents the supply of power to auxiliary battery 3 if the state of charge does not exceed the threshold.

The power supply circuit is preferably able to convert any level of input voltage to the required charging voltage of the auxiliary battery.

One significant issue with prior art dual battery systems is that there is a delay between measurement of a parameter indicative of a need to switch connections and the actual switching of those connections. The delay is often attributable to the use of complex and uncertain algorithms used in conditions where noise can easily alter the outcome of the controls. A preferred feature of the present invention is that the power supply circuit operates without delay to supply or cease supply of current to the auxiliary battery as soon as the presence or absence of the surplus condition is detected.

The amount of current supplied by the power supply circuit to the auxiliary battery when the surplus condition is exceeded may be a fixed amount. This is illustrated graphically in FIG. 2, where the top chart illustrates the starter battery (primary battery) voltage "$V_{sb}$" over time, and the bottom chart illustrates the current supplied by the power supply circuit "$I_{psc}$" over time.

Starting at the left hand side of FIG. 2, it will be seen that initially the starter battery voltage is below 12.7 volts and the power supply circuit current is off. Then, as soon as the starter battery voltage reaches 12.7 volts, the power supply circuit current is turned on to a fixed current level. The power supply circuit current continues at the fixed rate while the starter battery voltage remains above 12.7 volts, but as soon as the starter battery voltage drops below 12.7 volts the power supply circuit current is turned off, isolating the auxiliary battery so that the full benefit of the power generated by the alternator is restored to recharging the starter battery.

Figure 2:
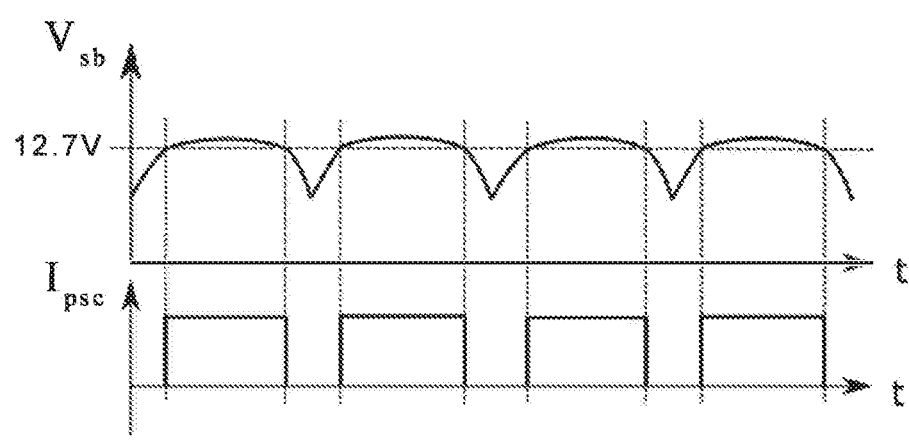
FIG. 2 is a diagram depicting voltage against time, illustrating how the supply of current by the power supply circuit to the auxiliary battery corresponds with the primary battery exceeding the surplus condition, according to an embodiment of the present invention.

As the rest of the charts in FIG. 2 show, this cycle continues to repeat while the vehicle's engine is running, ensuring as a matter of first priority that the primary battery is always in a near-fully-charged state, while at the same time allowing opportunistic charging of the auxiliary battery.

Figure 3:
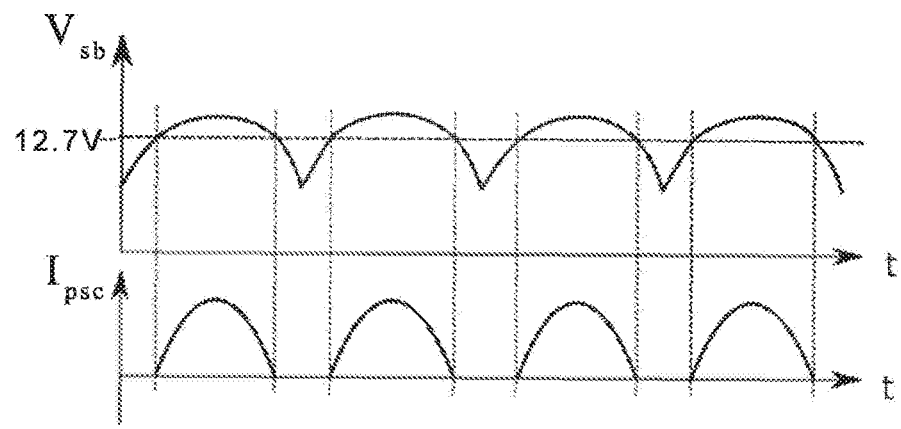
FIG. 3 is a diagram depicting voltage against time, illustrating how the supply of current by the power supply circuit to the auxiliary battery corresponds with the primary battery exceeding the surplus condition, according to an alternative embodiment of the present invention.

As an alternative to the fixed current arrangement illustrated in FIG. 2, the amount of current supplied by the power supply circuit to the auxiliary battery may be proportional to the amount by which the surplus condition is exceeded, as illustrated in FIG. 3.

Starting at the left hand side of FIG. 3, it will be seen that initially the starter battery voltage is below 12.7 volts and the power supply circuit current is off. Then, as soon as the starter battery voltage reaches 12.7 volts, the power supply circuit current is turned on at a current level which is proportionate to the amount by which the starter battery voltage exceeds 12.7 volts. As the starter battery voltage reaches its peak level, the power supply circuit current also reaches its peak level.

As the starter battery voltage falls from its peak level, the power supply circuit current also falls, until the starter battery voltage drops below 12.7 volts, at which point the power supply circuit current is turned off, isolating the auxiliary battery so that the full benefit of the power generated by the alternator is restored to recharging the starter battery.

As the rest of the charts in FIG. 3 show, this cycle continues to repeat while the vehicle's engine is running, ensuring as a matter of first priority that the primary battery is always in a near-fully-charged state, while at the same time allowing opportunistic charging of the auxiliary battery.

The above description of background art is included to explain the context of the present invention. It is not taken as an admission that any of the documents or other material referred to was published, known or part of the common general knowledge at the priority date of any one of the claims of this specification.

The invention claimed is:

1. A dual battery system, including:
   a primary battery which drives a starter motor;
   an auxiliary battery which drives one or more auxiliary loads;
   an alternator which supplies current to recharge the primary battery; and
   a power supply circuit which supplies current from the alternator to recharge the auxiliary battery when a surplus condition is detected, the surplus condition indicating that the alternator is generating more electrical power than is required for recharging the primary battery,
   wherein the power supply circuit ceases to supply current to recharge the auxiliary battery when absence of the surplus condition is detected so that the primary and auxiliary batteries become electrically isolated, thereby ensuring that recharging of the auxiliary battery does not have an adverse effect on the level of charge of the primary battery.

2. A dual battery system according to claim 1 wherein the surplus condition is determined to exist when voltage measured across the primary battery exceeds a threshold level.

3. A dual battery system according to claim 2 wherein the primary battery is a lead flooded battery and the threshold level is between 11.8 volts and 14.0 volts.

4. A dual battery system according to claim 3 wherein the threshold level is adjustable.

5. A dual battery system according to claim 1 wherein the surplus condition is determined to exist when a state of charge measurement of the primary battery indicates that the primary battery has a state of charge exceeding a threshold level.

6. A dual battery system according to claim 5 wherein the state of charge of the primary battery is determined using measurements of both voltage and current of the primary battery.

7. A dual battery system according to claim 1 wherein the power supply circuit is able to convert any level of input voltage to the required charging voltage of the auxiliary battery.

8. A dual battery system according to claim 1 wherein the power supply circuit operates without delay to supply or cease supply of current to the auxiliary battery as soon as the surplus condition or absence of the surplus condition is detected.

9. A dual battery system according to claim 1 wherein the amount of current supplied by the power supply circuit to the auxiliary battery when the surplus condition is detected is a fixed amount.

10. A dual battery system according to claim 2 wherein the amount of current supplied by the power supply circuit to the auxiliary battery when the surplus condition is detected is proportional to the amount of current by which the voltage measured across the primary battery exceeds the threshold level.

11. A method of controlling a dual battery system, the method including:
- driving a starter motor using a primary battery;
- driving one or more auxiliary loads using an auxiliary battery;
- supplying current to recharge the primary battery using an alternator;
- detecting a surplus condition indicating that the alternator is generating more electrical power than is required for recharging the primary battery;
- a power supply circuit supplying current from the alternator to recharge the auxiliary battery when the surplus condition is detected;
- detecting absence of the surplus condition indicating that the alternator is no longer generating more electrical power than is required for recharging the primary battery; and
- the power supply circuit ceasing to supply current to recharge the auxiliary battery when absence of the surplus condition is detected and electrically isolating the primary and auxiliary batteries, thereby ensuring that recharging of the auxiliary battery does not have an adverse effect on the level of charge of the primary battery.

* * * * *